United States Patent (10) Patent No.: US 8,404,193 B2
Sekihara et al. (45) Date of Patent: Mar. 26, 2013

(54) MICROCHIP AND PROCESS FOR PRODUCING MICROCHIP

(75) Inventors: Kanji Sekihara, Toyokawa (JP); Takehiko Goshima, Kunitachi (JP)

(73) Assignee: Konica Minolta Opto, Inc., Tokyo (JP)

( * ) Notice: Subject to any disclaimer, the term of this patent is extended or adjusted under 35 U.S.C. 154(b) by 91 days.

(21) Appl. No.: 13/057,466

(22) PCT Filed: Jul. 13, 2009

(86) PCT No.: PCT/JP2009/062668
§ 371 (c)(1),
(2), (4) Date: Feb. 3, 2011

(87) PCT Pub. No.: WO2010/016359
PCT Pub. Date: Feb. 11, 2010

(65) Prior Publication Data
US 2011/0135539 A1 Jun. 9, 2011

(30) Foreign Application Priority Data
Aug. 8, 2008 (JP) ................................. 2008-205342

(51) Int. Cl.
*G01N 33/48* (2006.01)
*B29C 45/14* (2006.01)

(52) U.S. Cl. ........ 422/503; 422/68.1; 422/243; 156/245

(58) Field of Classification Search .................. None
See application file for complete search history.

(56) References Cited

U.S. PATENT DOCUMENTS
2005/0118068 A1 6/2005 Kahl

2010/0158772 A1* 6/2010 Gerdts et al. ............... 422/245.1

FOREIGN PATENT DOCUMENTS

| JP | 07-232378 | 9/1995 |
|---|---|---|
| JP | 11-248678 | 9/1999 |
| JP | 2002-345791 | 12/2002 |
| JP | 2003004700 | * 1/2003 |
| JP | 2003-215140 | 7/2003 |
| JP | 2005-040983 | 2/2005 |
| JP | 2006-234600 | 9/2006 |
| JP | 2007-229589 | 9/2007 |
| JP | 2008-139237 | 6/2008 |

* cited by examiner

*Primary Examiner* — In Suk Bullock
*Assistant Examiner* — Timothy G Kingan
(74) *Attorney, Agent, or Firm* — Cozen O'Connor

(57) ABSTRACT

A microchip which comprises: a resinous base having a plurality of fine channels formed on one side thereof, one or more cylindrical parts disposed so as to protrude from the other side, and a through-hole which pierces each cylindrical part along the axis thereof and communicates with the fine channel so that the diameter of the inner wall of the through-hole gradually decreases from the tip end of the cylindrical part toward the fine channel at a first inclination angle; and a resinous covering member bonded to that side of the resinous base on which the fine channels have been formed. The microchip has been configured so that a liquid sample can be introduced from the tip end of each cylindrical part through the through-hole. The wall thickness of the cylindrical part on the end side where a liquid sample is to be introduced has been made smaller than the wall thickness thereof on the base side where the cylindrical part has been formed, by forming a step therebetween.

4 Claims, 4 Drawing Sheets

FIG. 6

| | \|θ1\|>\|θ2\| | INCLINATION ANGLE θ1 | INCLINATION ANGLE θ2 | FINE PITCH | DEGREE OF DIFFICULTY IN MEETING THE REQUIREMENTS FOR THE WALL THICKNESS | DEFORMATION DUE TO MOLD RELEASING |
|---|---|---|---|---|---|---|
| EXAMPLE 1 | YES | 2° | 0° | A | A | C |
| EXAMPLE 2 | YES | 3° | 1° | A | A | B |
| EXAMPLE 3 | YES | 5° | 3° | B | B | A |
| EXAMPLE 4 | YES | 7° | 5° | B | B | A |
| COMPARATIVE EXAMPLE 1 | NO | 4° | 6° | C | C | B |

MICROCHIP AND PROCESS FOR PRODUCING MICROCHIP

RELATED APPLICATIONS

This application is a U.S. National Phase Application under 35 USC 371 of International Application PCT/JP2009/062668 filed Jul. 13, 2009.

This application claims the priority of Japanese application 2008-205342 filed Aug. 8, 2008, the entire content of which is hereby incorporated by reference.

TECHNICAL FIELD

The present invention relates to a resinous microchip and process for producing the same.

BACKGROUND ART

The devices having been put into commercial use include a microanalysis chip or a device known under the name of μTAS (Micro Total Analysis Systems) wherein a fine channel or circuit is formed on a silicon and glass substrate by a microfabrication technology to perform chemical reaction, separation and analysis of such a liquid sample as a nucleic acid, protein and blood in the fine space. This kind of microchip has the advantages of reducing the amount of the sample or reagent solution to be used and the amount of waste liquid to be discharged, and providing a low-cost system characterized by space saving properties and portability. A microchip is produced by bonding two members wherein at least one of these members is provided with microfabrication.

In a conventional technique, a glass substrate has been used to produce a microchip, and various forms of microfabrication technologies have been introduced. For example, a photo resist method is used to form a fine channel on the surface of a glass substrate (Patent Literature 1). However, the glass substrate requires an extremely high product cost and is not fit for high-volume production. Thus, there is an increasingly vocal demand for development of a low-cost, disposable and resinous microchip.

Another conventional method is to form a fine channel on a PDMS (polydimethyl siloxane) substrate by optical photolithography (Patent Literature 2). However, this method has an advantage of an edge remaining on the fine channel formed by optical photolithography (so that the edge and coiner of the fine channel does not sag). However, the photolithography produces a high-cost microchip.

One of the conventional methods (Patent Literature 3) mainly intended to produce a low-cost microchip includes an injection molding technique for forming a fine channel on a plate-formed substrate. This injection molding technique is required to ensure an advanced level of transferability of the fine channel in order to keep an edge remaining on the fine channel, for example, by increasing the injection pressure and injection speed. An attempt to ensure an advanced level of transferability increases the mold releasing resistance, with the result that release of the molded product will become difficult. If undue force is applied to release the product from the mold, distortion will remain on the bonded surface (surface on one side) wherein the fine channel has been formed. Further, increase of the mold releasing resistance deforms the fine channel at the time of mold separation, and the flatness of the bonded surface of the substrate will be reduced by the wavy pattern or curvature occurring at the time of mold releasing. The bonded surface (surface on one side) is bonded with a covering material.

The resinous substrate provided with one or more cylindrical parts (chimneys) protruding in the direction perpendicular to the surface (e.g., surface on the other side) opposite the bonded surface of the substrate has a through-hole (well) which penetrates each cylindrical part along the axis of the cylindrical part from the tip end of the cylindrical part to the fine channel and communicates with the fine channel. A solution as a sample and reagent is led into the fine channel through the through-hole. This requires the cylindrical part to have the strength in excess of a prescribed level. The wall thickness of the cylindrical part must be increased to meet this requirement of strength.

If a plurality of cylindrical parts are arranged at a finer pitch, a great number of cylindrical parts can be provided on the substrate having a prescribed area. If cylindrical parts are to be arranged at a fine pitch, for example, at intervals of 0.5 mm through 10 mm, the most advantageous way is to ensure that both the inclination angle (tapering angle) of the outer wall of the cylindrical part in the direction wherein the through-hole is formed, and the inclination angle (tapering angle) of the inner wall of the through-hole in the direction wherein the through-hole is formed are set to zero; namely, that both the outer wall of the cylindrical part and the inner wall of the through-hole are formed into vertical walls. Further, when both the outer wall of the cylindrical part and the inner wall of the through-hole are formed into vertical walls, it will become easier to ensure the wall thickness of the cylindrical part.

In the injection molding of a resinous substrate, the force of bringing the inner wall of the through-hole in closer contact with the mold is increased by the shrinkage of the molded resin, and hence the resistance to the release of the through-hole from the mold is increased. This brings about a notable tendency of causing deformation of the fine channel and deterioration in the flatness of the substrate in the vicinity of the through-hole.

Particular in the injection molding of the resinous substrate provided with one or more through-holes, the inner wall of the through-hole is brought in close contact with the mold by the shrinkage of molded resin, and the resistance to the release of the through-hole from the mold is increased. This brings about a tendency of causing a considerable deformation of the fine channel of the cylindrical part and notable deterioration in the flatness of the substrate in the vicinity of the through-hole.

PRIOR ART LITERATURE

Patent Literature

Patent Literature 1: Japanese Unexamined Patent Application Publication No. 2003-215140
Patent Literature 2: Japanese Unexamined Patent Application Publication No. 2006-53064
Patent Literature 3: Japanese Unexamined Patent Application Publication No. 2006-234600

SUMMARY OF THE INVENTION

Problems to be Solved by the Invention

However, in the conventional art described in the above-mentioned Patent Literature 3, an increase in the inclination angle (tapering angle) of the outer wall of the cylindrical part in the direction wherein the through-hole is formed will cause an extension of an approximate conical trapezoidal base portion wherein the outer diameter of the cylindrical part is gradually increased, from the tip end of the cylindrical part to the surface (of the other side) opposite the bonded surface of the substrate. This, in turn, increases the pitch of the cylindrical parts to be arranged, and will make it difficult to form a great number of cylindrical parts on the substrate having a prescribed area. This also makes it difficult to ensure the wall thickness of the cylindrical part. Such problems have been left unsolved.

Further, if there is a decrease in the inclination angle (tapering angle) of the outer wall of the cylindrical part in the direction wherein the through-hole is formed, there is little change in the hole diameter when the hole diameter is gradually reduced along the center axis of the cylindrical part from the tip end of the cylindrical part to the fine channel. Thus, as described above, the resistance to release of the through-hole from the mold is increased more if there is less change in the hole diameter on the inner wall of the through-hole when the inner wall of the through-hole is brought in close contact with the mold by the shrinkage of the injection-molded resin. This causes deformation when the cylindrical part and fine channel are released from the mold. Such a problem can be solved by increasing the inclination angle of the inner wall, but the conventional method has been limited in solving the problems involved in the above-mentioned pitch and wall thickness.

The object of the present invention is to provide a resinous substrate wherein a plurality of cylindrical parts can be arranged in fine pitches when the deformation due to mold releasing subsequent to injection molding are reduced, and the requirements for wall thickness of the cylindrical part are satisfied.

Means for Solving the Problems

To solve the aforementioned problems, the first embodiment is a microchip which comprises: a resinous base having one or more cylindrical parts protruding from one surface of a substrate, with a plurality of line channels formed on the other surface of the substrate, and a through-hole which penetrates each cylindrical part along an axis of the cylindrical part in such a way that a diameter of an inner wall of the through-hole gradually decreases from a tip end of the cylindrical part to a fine channel of the plurality of fine channels at a first inclination angle, and which communicates with the fine channel; and a resinous covering member bonded to the other surface of the resinous substrate on which the fine channels are formed, wherein the aforementioned microchip is configured to introduce a liquid sample from the tip end of the cylindrical part through the through-hole; wherein a wall thickness of the cylindrical part on a lip end side of the cylindrical part to be supplied with a liquid sample is made smaller than a wall thickness on a substrate side of the cylindrical part on which the cylindrical part is formed, via a step formed therebetween.

The second embodiment is a microchip wherein the cylindrical part of the first embodiment is formed in an approximate truncated cone shape wherein a diameter of an outer wall of the cylindrical part is gradually increased at a second inclination angle from the tip end of the cylindrical part toward the aforementioned other surface; the outer wall of the cylindrical part is formed in such a way that the second inclination angle is greater than 0 degree without exceeding 5 degrees; and an inner wall of the cylindrical part is formed in such a way that an absolute value of the first inclination angle is greater than that of the second inclination angle.

The third embodiment is a microchip wherein the first inclination angle of the microchip of the first embodiment is 3 degrees or more without exceeding 7 degrees.

The fourth embodiment is a microchip manufacture method including a molding step for molding a resinous substrate by charging resinous material into a cavity formed by matching a first mold and a second mold, the aforementioned resinous substrate includes: a plurality of fine channels on one surface of the substrate, one or more cylindrical parts protruding externally from the other surface on the other surface, and a through-hole which penetrates each cylindrical part along an axis of the cylindrical part in such a way that a diameter of an inner wall of the through-hole gradually decreases from a tip end of the cylindrical part to a fine channel of the plurality of fine channels at a first inclination angle, and which communicates with the fine channel; a mold releasing step for releasing the resinous substrate subsequent to the aforementioned molding step from the mold; and a bonding step for bonding the resinous covering member on one surface provided with the plurality of fine channels of the resinous substrate released from the mold in the aforementioned mold releasing step; wherein a portion for forming the fine channel is formed on one of the first and second molds, and the other mold is provided with a concave for forming the cylindrical part, and a pin for forming the taper corresponding to the first inclination angle for forming the through-hole inside the concave, the pin protruded toward said one of the first mold and the second mold; and wherein in the aforementioned molding step, a tip end of the pin of the other mold is brought in contact with the fine channel forming portion of one of the first mold and the second mold, and the resinous material is charged; and in the aforementioned mold releasing step, the pin of the other mold is further protruded from the position of contact with the fine channel forming portion toward said one of the first mold and the second mold, whereby the resinous substrate is released from the other mold.

Effects of the Invention

The prevent invention provides a resinous substrate that ensures a plurality of cylindrical parts to be arranged in fine pitches when the deformation due to mold releasing subsequent to injection molding are reduced, and the requirements for wall thickness of the cylindrical parts are satisfied, and a microchip using the aforementioned resinous substrate.

BRIEF DESCRIPTION OF THE DRAWINGS

FIG. 6 is an explanatory diagram representing the production of the resinous substrate using a mold for injection molding in an Example, and the performances of the resinous substrate.

BEST MODE FOR CARRYING OUT THE INVENTION

Embodiment 1

Configuration of Resinous Substrate

Figure 1:
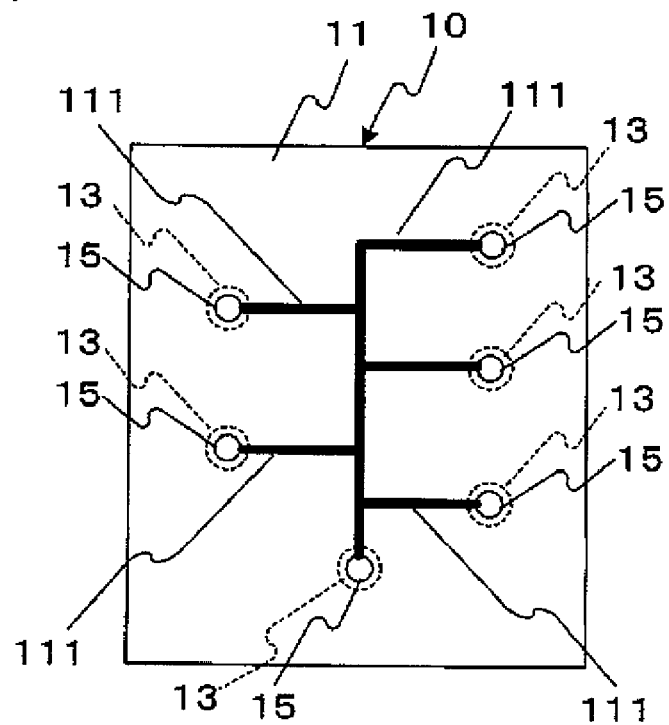
FIG. 1 is a plan view showing the resinous substrate as a first embodiment of the present invention.
Figure 2:
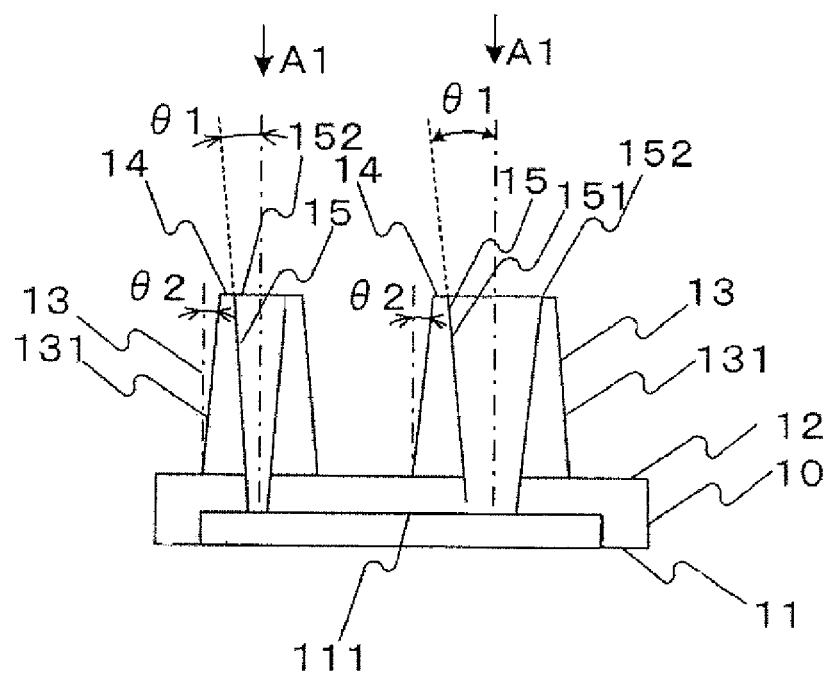
FIG. 2 is a cross section representing the resinous substrate.

The following describes the best form of embodiment of the present invention with reference to drawings: FIG. 1 is a plan view showing the resinous substrate as a first embodiment of the present invention. FIG. 2 is a cross section representing the resinous substrate.

In the aforementioned resinous substrate, a fine channel 111 is formed on a first surface 11 of the plate-formed substrate 10. The first surface 11 provided with the fine channel 111 is a bonded surface. The aforementioned first surface 11 of the plate-formed substrate 10 is bonded with a covering member (not illustrated). The second surface 12 of the substrate 10 is a plane surface without a fine channel provided thereon.

A plurality of cylindrical parts 13 protruding in the direction perpendicular to the second surface 12 are formed on the second surface 12 of the substrate 10. These cylindrical parts 13 are formed in an approximate conical trapezoid wherein the outer diameter is gradually increased from the end 14 of each of the cylindrical parts 13 to the second surface 12.

FIG. 1 shows a plurality of fine channel 111 formed on one end 11, and the cylindrical parts 13 formed on the end of the fine channel 111. The microchip is composed of the substrate 10 and the covering material (not illustrated) bonded to the one end of the substrate 10.

The substrate 10 is a plate-formed member having outer dimensions of 50 mm by 50 mm by 1.5 mm wherein a cyclic polyolefin resin of transparent resinous material is formed by an injection molding machine. The fine channel 111 has a width of 50 μm and a depth of 50 μm.

The covering material is made of a cyclic polyolefin resin of transparent resinous material, and has outer dimensions of 50 mm by 50 mm by (30 μm through 300 μm wide).

The following describes the details of the resinous material of the substrate 10 and others. The requirements for resinous material include excellent moldability (transferability and mold release characteristics), a high level of transparency, and lower self-fluorescence in response to ultraviolet rays and visible rays. However, the resinous material is not subjected to particular restrictions. The preferably used examples include polycarbonate, methyl polymethacrylate, polystyrene, polyacrylonitrile, vinyl polychloride, polyethylene terephthalate, nylon 6, nylon 66, vinyl polyacetate, vinylidene polychloride, polypropylene, polyisoprene, polyethylene, polydimethyl siloxane, and cyclic polyolefin. Use of methyl polymethacrylate and cyclic polyolefin is particularly preferred. The substrate 10 and covering material are can be formed of the same material or different materials.

The substrate 10 has a through-hole 15 which penetrates each cylindrical part in such a way that the hole diameter gradually decreases from the end 14 of the cylindrical parts 13 to the fine channel 111 along the center axis of the cylindrical part 13. The inner wall 151 of the through-hole 15 is provided with a first inclination angle $\theta 1$ in the penetrating direction A1 of the through-hole 15.

The following describes the second inclination angle $\theta 2$ of the outer wall 131 of the cylindrical parts 13 in the penetrating direction A1 of the through-hole 15. The inclination angle $\theta 2$ of the outer wall 131 of the cylindrical parts 13 is set to meet the requirements of arranging the cylindrical parts 13 at a fine pitch. The fine pitch in the sense in which it is used here refers to the interval (pitch) between two through-holes 15 which is 1.1 times or more without exceeding 5 times the maximum diameter of two mutually adjacent through-holes. In the first embodiment, the second inclination angle $\theta 2$ of the outer wall 131 of the cylindrical parts 13 is set to be greater than 0 without exceeding 5 degrees.

To meet the requirement of arranging the cylindrical parts 13 at a fine pitch, the second inclination angle $\theta 2$ of the outer wall 131 of the cylindrical parts 13 is preferably close to zero degree. Further, to facilitate satisfaction of the requirements for the wall thickness of the cylindrical parts 13, the preferred angle is the one closer to zero without exceeding 5 degrees. Similarly to the case of the second inclination angle $\theta 2$ of the outer wall 131 of the cylindrical parts 13, however, if the first inclination angle $\theta 1$ of the inner wall 151 of the through-hole 15 is closer to zero degree, the inner wall 151 of the through-hole 15 is brought into closer contact with part (core pin) of the mold by shrinkage of the injection-molded resin. This will increase the resistance to mold releasing. This, in turn, may cause deformation of the substrate 10 due to mold releasing, in particular, deformation of the cylindrical parts 13.

To reduce the resistance to mold release at the time of injection molding operation, the absolute value of the first inclination angle $\theta 1$ and that of the second inclination angle $\theta 2$ of the outer wall 131 of the cylindrical parts 13 are set to have the following order of magnitude.

The outer wall 131 of the cylindrical part 13 and the inner wall 151 of the through-hole 15 are formed in such a way that the absolute value of the first inclination angle $\theta 1$ of the inner wall 151 of the through-hole 15 is greater than that of the second inclination angle $\theta 2$ of the outer wall 131 of the cylindrical parts 13.

When the absolute value of the first inclination angle $\theta 1$ of the inner wall 151 of the through-hole 15 is greater than that of the second inclination angle $\theta 2$ of the outer wall 131 of the cylindrical parts 13, the resistance to mold releasing can be reduced when the inner wall 151 of the through-hole 15 is separated from the part of the mold, and the deformation of the cylindrical parts 13 due to mold releasing and the fine channel 111 in the vicinity of the through-hole 15 can be diminished. Further, this arrangement prevents the cylindrical parts 13 from having thin wall surfaces and permits the required strength of the cylindrical parts 13 to be maintained.

When the cylindrical parts 13 are to be arranged at a fine pitch of 0.5 through 10 mm, for example, the absolute value of the first inclination angle $\theta 1$ of the inner wall 151 of the through-hole 15 and that of the second inclination angle $\theta 2$ of the outer wall 131 of the cylindrical parts 13 are set to have the following order of magnitude.

Assume, for example, that the absolute value of the first inclination angle $\theta 1$ of the inner wall 151 of the through-hole 15 is set at 1 degree. Then the second inclination angle $\theta 2$ of the outer wall 131 of the cylindrical parts 13 is set at 0.5 degree. Further, when the absolute value of the first inclination angle $\theta 1$ of the inner wall 151 of the through-hole 15 is set, for example, at 3 degree, then the second inclination angle $\theta 2$ of the outer wall 131 of the cylindrical parts 13 is set at 2 degrees.

Further, assume, for example, that the absolute value of the first inclination angle $\theta 1$ of the inner wall 151 of the through-hole 15 is set at 5 degrees. Then the second inclination angle $\theta 2$ of the outer wall 131 of the cylindrical parts 13 is set at 4 degrees.

As described above, the absolute value of the first inclination angle $\theta 1$ of the inner wall 151 of the through-hole 15 is set at a value greater than that of the second inclination angle $\theta 2$ of the outer wall 131 of the cylindrical parts 13. Thus, even if the inner wall 151 of the through-hole 15 has been brought in contact with part (core pin) of the mold by the shrinkage of the resin at the time of injection molding, this arrangement reduces the resistance to molding releasing and suppresses the deformation of the cylindrical parts 13 due to mold releasing.

[Mold for Injection Molding]

Figure 3:
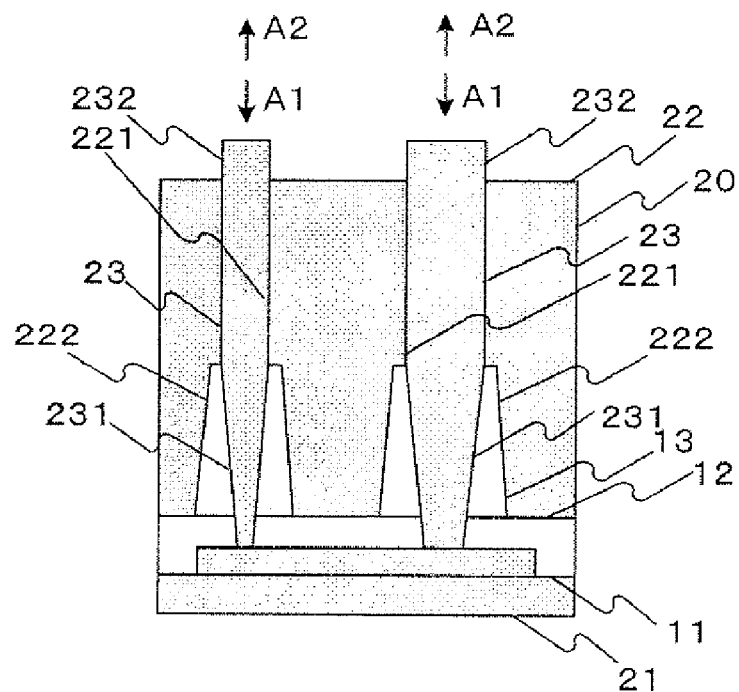
FIG. 3 is a cross section representing a mold for injection molding.

Referring to FIG. 3, the following describes the configuration of the mold for injection molding: FIG. 3 is a cross section representing a mold for injection molding.

The mold 20 for injection molding has a first mold 21, a second mold 22 and a core pin 23.

The first mold 21 constitutes the first surface 11 wherein the fine channel 111 is formed. The second mold 22 constitutes the second surface 12, and forms a cavity when combined with the first mold 21. The substrate 10 is formed by filling the cavity with resin material.

The core pin 23 is protruded from the second mold 22 toward the first mold 21, thereby forming part of the second mold 22 that constitutes the through-hole 15.

In the core pin 23, the tapering portion 231 on the end side and the cylindrical portion 232 on the base end side are formed as an integral unit. FIG. 3 shows that the cylindrical portion 232 is driven into the prepared hole 221 of the second mold 22 and the tapering portion 231 is protruded toward the first mold 21 in the cavity. Under this condition, the tapering portion 231 constitutes part of the second mold 22 for forming the through-hole 15.

The following describes the procedure of injection-molding the resinous substrate using the mold 20 for injection molding described above.

(Mold Clamping Step)

Bring the second mold 22 as a mold on the movable side close to the first mold 21 as a mold on the stationary side to fit them together. The concave portion 222 of the second mold 22 is blocked by the first mold 21, whereby a cavity is formed.

(Configuration Step)

The tapering portion 231 is protruded toward the first mold 21 in the concave portion 222, and constitutes the second mold 22 for forming the through-hole 15. The tapering portion 231 protruded toward the first mold 21 contacts part of the first mold 21 constituting the first surface 11 (bonded surface of the molded product) of the substrate 10.

The configuration step can be positioned before, after or during the mold fitting step. It is also possible to adopt such a structure that, in the initial phase of the configuration step, the tapering portion 231 is driven into the prepared hole 221 of the second mold 22, and is protruded from the prepared hole 221 toward the first mold 21 by the phase of completing the configuration step so as to be positioned inside the concave portion 222 of the second mold 22.

(Injection Step)

A molded product as a substrate 10 is molded by filling the cavity with resinous material. A fine channel is formed on the first surface 11 of the substrate 10, and the through-hole 15 is formed on the substrate 10. To meet the requirements for a higher level of transferability in the fine channel, injection molding operation is performed at a high molding pressure with a high injection speed. The second surface 12 of the substrate 10 and the outer wall 131 of the cylindrical part 13 are brought into contact with the second mold 22, and constitute part of the second mold 22. The inner wall 151 of the through-hole 15 is brought in contact with the tapering portion 231 provided with surface roughing operation. Further, the first surface 11 of the substrate 10 comes in close contact with the first mold 21.

(Separation Step)

Then the second mold 22 as a mold on the movable side is kept away from the first mold 21 as a mold on the stationary side. The area in close contact with the molded product is smaller for the first mold 21 than for the second mold 22. Thus, if the second mold 22 is separated from the first mold 21, the first surface 11 (bonded surface of the molded product) of the substrate 10 is separated from the first mold 21.

(Protruding Step)

When the inner wall 151 of the through-hole 15 is protruded by the further protruded tapering portion 231 from inside the concave portion 222 of the second mold 22 toward the first mold 21 (in the direction A1 of FIG. 2), the second surface 12 (plane surface of the molded product) of the substrate 10 is separated from the second mold 22. The substrate 10 is separated from the second mold 22 while the inner wall 151 of the through-hole 15 is kept in close contact with the tapering portion 231.

As described above, the absolute value of the first inclination angle $\theta 1$ of the inner wall 151 of the through-hole 15 is greater than that of the second inclination angle $\theta 2$ of the outer wall 131 of the cylindrical parts 13, and the absolute value of the second inclination angle $\theta 2$ is set at a smaller level. However, the outer wall 131 of the cylindrical parts 13 shrinks in the direction of separating from the second mold 22 by the shrinkage of the molded resin. This reduces the resistance to mold releasing when the outer wall 131 of the cylindrical parts 13 is separated from the second mold 22. This arrangement suppresses the deformation of the cylindrical parts 13 due to mold releasing.

If the first inclination angle $\theta 1$ of the inner wall 151 of the through-hole 15 is increased, the aforementioned deformation of the cylindrical parts 13 due to mold releasing can be suppressed. However, in the present invention, $\theta 1$ is preferably set at 3 degrees or more without exceeding 7 degrees, whereby the cylindrical parts 13 secured at a finer pitch can be formed without deformation due to mold releasing. $\theta 1$ is more preferably set at 5 degrees or more without exceeding 7 degrees.

(Retraction Step)

In this step, the core pin 23 is moved in the direction (A2 in FIG. 3) opposite the direction wherein the core pin 23 is protruded. This allows the inlet circumferential portion 152 (end 14 of the cylindrical parts 13) of the through-hole 15 to abut on the edge portion of the prepared hole 221. Further, when the core pin 23 is moved to the opposite side, the edge portion of the prepared hole 221 in relative terms pushes out the inlet circumferential portion 152 (end 14 of the cylindrical parts 13) of the through-hole 15. This procedure allows the tapering portion 231 to be pulled out of the through-hole 15, and separates it from the inner wall 151 of the through hole 15. In the push-out step as a preceding step, the outer wall 131 of the cylindrical parts 13 has been separated from the second mold 22. Accordingly, there is little overall resistance to mold releasing, and deformation of the cylindrical parts 13 due to mold releasing can be avoided. Further, the absolute value of the first inclination angle $\theta 1$ of the inner wall 151 of the through-hole 15 is greater than that of the second inclination angle $\theta 2$ of the outer wall 131 of the cylindrical parts 13. Accordingly, when the tapering portion 231 is pulled out of the through-hole 15, there is little resistance to mold releasing. This also helps avoid the deformation of the cylindrical parts 13 due to mold releasing. Thus, the molded product as the substrate 10 can be taken out because the entire portion in close contact with the mold is removed from the mold.

In the step of retraction, the tapering portion 231 is removed from the through-hole 15 by retracting the core pin 23 in relative terms. Without being restricted to this method, it is also possible to adopt the following structure: When the core pin 23 is externally fitted, the prepared hole 221 of the second mold 22 is provided with a sleeve that can be protruded or retracted, and the end face of the sleeve having refracted below the prepared hole 221 constitutes part of the second mold 22 for forming the inlet circumferential portion 152 (end 14 of the cylindrical parts 13) of the through-hole 15 of the cylindrical parts 13. When this sleeve is protruded toward the first mold 21 with respect to the core pin 23, the tapering portion 231 is pulled out of the through-hole 15 in relative terms.

Embodiment 2

Figure 4:
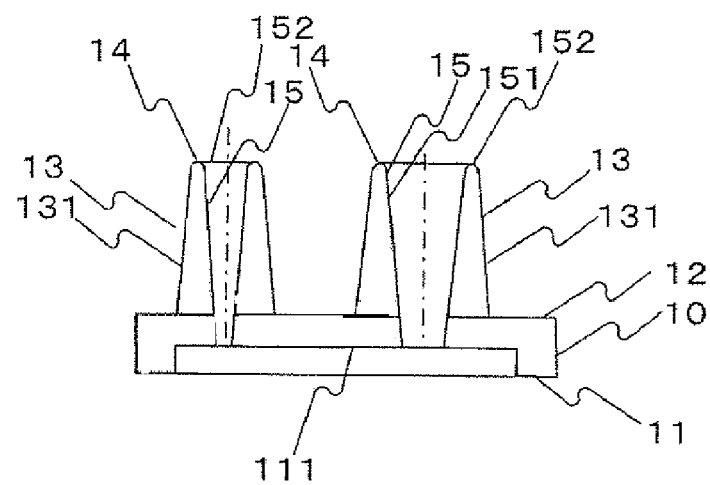
FIG. 4 is a cross section representing the resinous substrate as a second embodiment of the present invention.

Referring to FIG. 4, the following describes the resinous substrate as a second embodiment in the present invention.

The inlet circumferential portion 152 of the through-hole 15 (end 14 of the cylindrical parts 13) is formed in a convex curved surface.

In the electrophoretic process for analyzing the liquid sample, an electrode is mounted on the cylindrical part (chimney) arranged on both ends of the fine channel 111 so that an electric field is formed on the fine channel 111. For example, the negatively charged liquid sample moves from the cathode to the anode, with the result that the components of the liquid sample are separated in conformity to respective molecular weights.

FIG. 4 shows the inlet circumferential portion 152 of the through-hole 15 formed in a convex curved surface. As described above, when an electrode is inserted into the cylindrical through-hole 15 in the electrophoretic process, the electrode is guided into the through-hole 15 by the convex curved surface. This ensures easier insertion of the electrode into the through-hole 15, and improves the workability.

Figure 5:
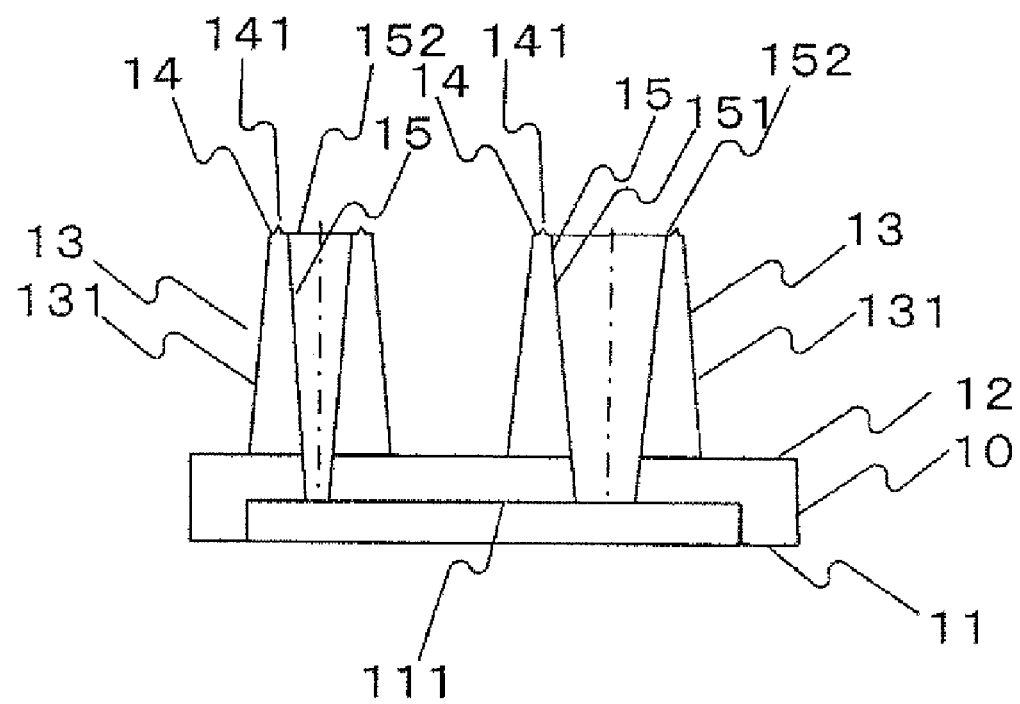
FIG. 5 is a cross section representing the resinous substrate as a variation of the second embodiment of the present invention.

Referring to FIG. 5, the following describes the resinous substrate as a variation of the second embodiment of the present invention.

FIG. 5 shows the end 14 of the cylindrical parts 13 where the convex portion 141.

In the electrophoretic process, a liquid sample is introduced from the nozzle (not illustrated) into the through-hole 15 of the cylindrical part 13.

In this case, the liquid sample of the nozzle is guided to the convex portion 141, hence to the through-hole 15. To be more specific, the liquid sample is blocked by the convex portion 141 wherein the wall thickness of the tip end side of the cylindrical parts 13 is smaller than that of the cylindrical part 13 on the side of the substrate where the cylindrical part 13 is formed by forming a step therebetween. This prevents the liquid sample from being leaked out of the through-hole 15, and eliminates the possibility of the liquid mining out of the nozzle to the end 14 of the cylindrical parts 13.

Embodiment 3

The following describes the resinous substrate as a third embodiment of the present invention.

In the aforementioned embodiment, the surface of the tapering portion 231 of the core pin 23 is finished to have the same surface precision as that of the cylindrical portion 232. However, the surface of the tapering portion 231 of the core pin 23 can be subjected to rough-machining. This procedure reduces the resistance to mold releasing when the inner wall 151 of the through-hole 15 is released from the tapering portion 231, and further reduces the deformation due to mold releasing.

The surface of the tapering portion 231 is subjected to surface rough-machining for the following reasons: From the standpoint of manufacturing a mold, the mold part (part of the second mold 22) constituting the outer wall 131 side of the cylindrical parts 13 is concaved, and rough-machining of the concave portion is very difficult. Extremely difficulties are involved in high-precision surface rough-machining of the end 14 of the cylindrical part 13 (a corner of the concave bottom surface on the mold). Conversely, the mold parts constituting the inner wall 151 of the through-hole 15 are concave portions including the core pin 23. Surface rough-machining of the outer periphery of the core pin 23 is comparatively easy.

The inner wall 151 of the through-hole 15 is machined to a surface roughness of Ra 0.1 μm or more without exceeding Ra 3 μm by the tapering portion 231 having been rough-machined. The surface roughness of the inner wall, 151 of the through-hole 15 is subjected to contact type measurement using a surface roughness measuring instrument (manufactured by Mitsutoyo Corporation). Further, when the contact type measurement cannot be applied, a laser microscope (by Keyence Corp./Olympus) or an optical interference surface roughness measuring instrument (Nihon Veeco K. K.) can be used to perform non-contact measurement.

EXAMPLES

Referring to FIG. 6, the following describes the greater details of the mold for injection molding in the present invention, the resinous substrate produced by the mold for injection molding, and the performance of the resinous substrate with reference to Examples. FIG. 6 is an explanatory diagram representing the production of the resinous substrate using a mold for injection molding in an Example, and the performances of the resinous substrate. It should be noted, however, that the invention is not restricted thereto. Further, the tapering portion 231 of the core pin 23 is not subjected to surface rough-machining.

In Examples 1 through 4, the inner wall 151 of the through-hole 15 and outer wall 131 of the cylindrical parts 13 have been formed to ensure that the absolute value of the first inclination angle $\theta1$ of the inner wall 151 of the through-hole 15 will be greater than that of the second inclination angle $\theta2$ of the outer wall 131 ($|\theta1|>|\theta2|$). In each of the Examples, the difference of both absolute values ($|\theta1|-|\theta2|$) is 2 degrees.

The following describes the Comparative Example for comparison with the Example: In the Comparative Example 1, the inner wall 151 of the through-hole 15 and outer wall 131 of the cylindrical parts 13 have been formed to ensure that the absolute value of the first inclination angle $\theta1$ of the inner wall 151 of the through-hole 15 will be greater than that of the second inclination angle $\theta2$ of the outer wall 131 ($|\theta1|<|\theta2|$). In each of the Examples, the difference of both absolute values ($|\theta2|-|\theta1|$) is 2 degrees.

Example 1

First inclination angle $\theta1$: 2 degrees

Second inclination angle $\theta2$: 0 degree

Example 2

First inclination angle $\theta1$: 3 degrees

Second inclination angle $\theta2$: 1 degree

Example 3

First inclination angle θ1: 5 degrees
Second inclination angle θ2: 3 degrees

Example 4

First inclination angle θ1: 7 degrees
Second inclination angle θ2: 5 degrees

Comparative Example 1

First inclination angle θ1: 4 degrees
Second inclination angle θ2: 6 degrees

The following describes the degree of difficulty in arranging the cylindrical parts at finer pitches for each of the Examples:

In Example 1, it was extremely easy to arrange the cylindrical parts at a fine pitch. It was also easy to meet the requirements for the wall thickness of the cylindrical parts. A slight degree of defamation of the cylindrical parts 13 due to mold releasing was observed although no problem was caused at all.

In Example 2, it was extremely easy to arrange the cylindrical parts at a fine pitch. It was also easy to meet the requirements for the wall thickness of the cylindrical parts. There was no deformation of the cylindrical parts 13 due to mold releasing.

In Example 3, it was extremely easy to arrange the cylindrical parts at a fine pitch. It was also easy to meet the requirements for the wall thickness of the cylindrical parts. Further, there was no deformation of the cylindrical parts 13 due to mold releasing. Resistance to mold releasing was very small.

In Example 4, it was extremely easy to arrange the cylindrical parts at a fine pitch. It was also easy to meet the requirements for wall thickness of the cylindrical parts. Further, there was no deformation of the cylindrical parts 13 due to mold releasing. Resistance to mold releasing was very small.

In Comparative Example, it was extremely difficult to arrange the cylindrical parts at a fine pitch. It was also difficult to meet the requirements for the wall thickness of the cylindrical parts. There was no deformation of the cylindrical parts 13 due to mold releasing.

The following describes the criteria for small pitch in the aforementioned Examples and Comparative Example: A symbol "A" was given when there was no designing restriction. A symbol "B" was given when design consideration was required. A symbol "C" was given when there is a layout difficulty in designing.

The following describes the criteria for the degree of difficulty in meeting the requirements for the wall thickness in the aforementioned Examples and Comparative Example: A symbol "A" was given when there was no designing restriction. A symbol "B" was given when design consideration was required. A symbol "C" was given when there is a layout difficulty in designing.

The following describes the procedure of evaluating the deformation due to mold releasing in the aforementioned Examples and Comparative Example: In the molded products of the Examples 1 through 4 and Comparative Example 1, a step is taken to measure the flatness of the surface wherein the fine channel is formed. The flatness is measured in the non-contact measurement method using a laser/white light interferometer and a grading incidence interferometer.

The following describes the procedure of evaluating the deformation due to mold releasing in the aforementioned Examples and Comparative Example: When the flatness PV did not exceed 15 μm, a symbol "A" was given. A symbol "B" was given when the flatness PV was greater than 15 μm without exceeding 20 μm, and there was no local surface collapse. A symbol "C" was given if the flatness PV was greater than 15 μm without exceeding 20 μm and there was local surface collapse. A symbol "D" was given when the flatness PV was greater than 20 μm.

As described above, the second inclination angle θ2 of the outer wall 131 of the cylindrical parts 13 is 0 degree or more without exceeding 5 degrees, the inclination angles of the inner wall and the outer wall are set to a prescribed order of magnitude, and the inclination angle of the outer wall is set at a prescribed value. This procedure has allowed the cylindrical parts 13 to be arranged at a fine pitch when the deformation due to mold releasing subsequent to injection molding are reduced, and the requirements for wall thickness of the cylindrical parts are satisfied. In the Comparative Example, however, it was difficult to arrange the cylindrical parts 13 at a fine pitch when the wall thickness requirements were satisfied.

EXPLANATION OF REFERENCE SYMBOLS

θ1. First inclination angle
θ2. Second inclination angle
10. Substrate
11. First surface (bonded surface)
111. Fine channel
12. Second surface
13. Cylindrical parts
131. Outer wall of cylindrical part
14. Tip end of the cylindrical part
141. Convex portion
15. Through-hole
151. Inner wall of through-hole
152. Inlet circumferential portion
20. Mold for injection molding
21. First mold
22. Second mold
221. Prepared hole
222. Concave portion
23. Core pin
231. Tapering portion
232. Cylindrical portion

The invention claimed is:
1. A microchip comprising:
a resinous base having at least one cylindrical part protruding from a surface of a substrate, a plurality of fine channels being formed on another surface of the substrate, and a through-hole penetrating the at least one cylindrical part along an axis of the at least one cylindrical part such that a diameter of an inner wall of the through-hole gradually decreases from a tip end of the at least one cylindrical part to a fine channel of the plurality of fine channels at a first inclination angle and in communication with the fine channel; and
a resinous covering member bonded to the other surface of the resinous substrate on which the plurality of fine channels is formed;
wherein the microchip is configured to introduce a liquid sample from the tip end of the at least one cylindrical part through the through-hole;
wherein the at least one cylindrical part is formed in an approximate truncated cone shape;

wherein a diameter of an outer wall of the at least one cylindrical part is gradually increased at a second inclination angle from the tip end of the at least one cylindrical part toward the other surface;

wherein the outer wall of the at least one cylindrical part is formed such that the second inclination angle is greater than 0 degree without exceeding 5 degrees; and wherein an inner wall of the at least one cylindrical part is formed such that an absolute value of the first inclination angle is greater than that of the second inclination angle.

2. The microchip of claim 1, wherein the first inclination angle of the microchip is 3 degrees or more.

3. A method for producing a microchip comprising:

a molding step for molding a resinous substrate by charging resinous material into a cavity formed by matching a first mold and a second mold, the resinous substrate including:
- a plurality of fine channels on a surface of the resinous substrate;
- at least one cylindrical part protruding externally from another surface of the substrate; and
- a through-hole which penetrates the at least one cylindrical part along an axis of the at least one cylindrical part such that a diameter of an inner wall of the through-hole gradually decreases from a tip end of the at least one cylindrical part to a fine channel of the plurality of fine channels at a first inclination angle, and the through-hole communicates with the fine channel;

a mold releasing step for releasing the resinous substrate subsequent to the molding step from the mold; and a bonding step for bonding a resinous covering member on the surface provided with the plurality of fine channels of the resinous substrate released from the mold in the mold releasing step;

wherein a portion for forming a fine channel of the plurality of fine channels is formed on one of the first mold and the second mold, and another mold is provided with a concave part for forming the at least one cylindrical part and a pin for forming a taper corresponding to the first inclination angle for forming the through-hole inside the concave part, the pin protruding toward said one of the first mold and the second mold;

wherein during the molding step, a tip end of the pin of the other mold is brought in contact with the fine channel forming portion of said one of the first mold and the second mold, and the resinous material is charged; and wherein during the mold releasing step, the pin of the other mold is further protruded from a position of contact with the fine channel forming portion toward said one of the first mold and the second mold, whereby the resinous substrate is released from the other mold.

4. The microchip of claim 1, wherein a wall thickness of the at least one cylindrical part on a tip end side of the at least one cylindrical part to be supplied with a liquid sample is made smaller than a wall thickness on a substrate side of the at least one cylindrical part on which the at least one cylindrical part is formed.

* * * * *